(12) United States Patent
Chethik

(10) Patent No.: US 6,697,996 B2
(45) Date of Patent: Feb. 24, 2004

(54) MULTI-DIMENSIONAL PACKET RECOVERY SYSTEM AND METHOD

(75) Inventor: Frank Chethik, Palo Alto, CA (US)

(73) Assignee: Lockheed Martin Corp., Bethesda, MD (US)

( * ) Notice: Subject to any disclaimer, the term of this patent is extended or adjusted under 35 U.S.C. 154(b) by 438 days.

(21) Appl. No.: 09/860,270

(22) Filed: May 18, 2001

(65) Prior Publication Data

US 2002/0174403 A1 Nov. 21, 2002

(51) Int. Cl.[7] .............................................. H03M 13/00
(52) U.S. Cl. ........................................ 714/804; 714/808
(58) Field of Search ......................... 395/377; 370/389, 370/349, 400; 714/804, 776, 775, 808

(56) References Cited

U.S. PATENT DOCUMENTS

| | | | | |
|---|---|---|---|---|
| 5,630,151 A | * | 5/1997 | Muramatsu et al. | 395/377 |
| 6,289,013 B1 | * | 9/2001 | Lakshman et al. | 370/389 |
| 6,574,213 B1 | * | 6/2003 | Anandakumar et al. | 370/349 |
| 6,594,268 B1 | * | 7/2003 | Aukia et al. | 370/400 |

* cited by examiner

Primary Examiner—David Ton
(74) Attorney, Agent, or Firm—Kenneth W. Float

(57) ABSTRACT

Multi-dimensional packet recovery systems and methods that permit recovery of lost packets and packets containing transmission errors that are transmitted over a network. The packet recovery systems and methods transmit a multi-dimensional array comprising rows, columns and hyperdimensional volumes of data packets between a source node and one or more destination nodes.

8 Claims, 5 Drawing Sheets

Fig. 2

BLOCK RECEIVED WITH 13 ERRORS

| D | D | D | D | D | D | D | P |
|---|---|---|---|---|---|---|---|
| D | D | D | D | D | D | D | P |
| D | D | D | D | D | D | D | P |
| D | D | D | D | D | D | E | P |
| D | D | D | D | D | D | D | P |
| D | D | D | D | D | D | D | P |
| D | D | D | D | D | D | D | P |
| P | P | P | P | P | P | P | P |

Fig. 3

BLOCK RECEIVED WITH 13 ERRORS

| D | D | E | D | E | D | D | P |
|---|---|---|---|---|---|---|---|
| D | D | D | D | E | E | D | P |
| D | D | D | D | E | D | D | E |
| D | D | D | D | D | D | E | P |
| D | D | E | D | D | D | D | P |
| D | E | D | E | D | E | D | P |
| D | D | D | E | D | D | D | P |
| P | P | P | P | P | P | E | P |

Fig. 4

FIRST ROW RECOVERY OF 4 PACKETS

| D | D | E | D | E | D | D | P |
|---|---|---|---|---|---|---|---|
| D | D | D | D | E | E | D | P |
| D | D | D | D | E | D | D | E |
| D | D | D | D | D | D | R | P |
| D | D | R | D | D | D | D | P |
| D | E | D | E | D | E | D | P |
| D | D | D | R | D | D | D | P |
| P | P | P | P | P | P | R | P |

Fig. 5

FIRST COLUMN RECOVERY OF 4 ADDITIONAL FAILED PACKETS

| D | D | R | D | E | D | D | P |
|---|---|---|---|---|---|---|---|
| D | D | D | D | E | E | D | P |
| D | D | D | D | E | D | D | R |
| D | D | D | D | D | D | R | P |
| D | D | R | D | D | D | D | P |
| D | R | D | R | D | E | D | P |
| D | D | D | R | D | D | D | P |
| P | P | P | P | P | P | R | P |

Fig. 6

SECOND ROW RECOVERY OF 4 PACKETS

| D | D | R | D | R | D | D | P |
|---|---|---|---|---|---|---|---|
| D | D | D | D | E | E | D | P |
| D | D | D | D | R | D | D | R |
| D | D | D | D | D | D | R | P |
| D | D | R | D | D | D | D | P |
| D | R | D | R | D | R | D | P |
| D | D | D | R | D | D | D | P |
| P | P | P | P | P | P | R | P |

Fig. 7

SECOND COLUMN RECOVERY OF 2 REMAINING PACKETS

| D | D | R | D | R | D | D | P |
|---|---|---|---|---|---|---|---|
| D | D | D | D | R | R | D | P |
| D | D | D | D | R | D | D | R |
| D | D | D | D | D | D | R | P |
| D | D | R | D | D | D | D | P |
| D | R | D | R | D | R | D | P |
| D | D | D | R | D | D | D | P |
| P | P | P | P | P | P | R | P |

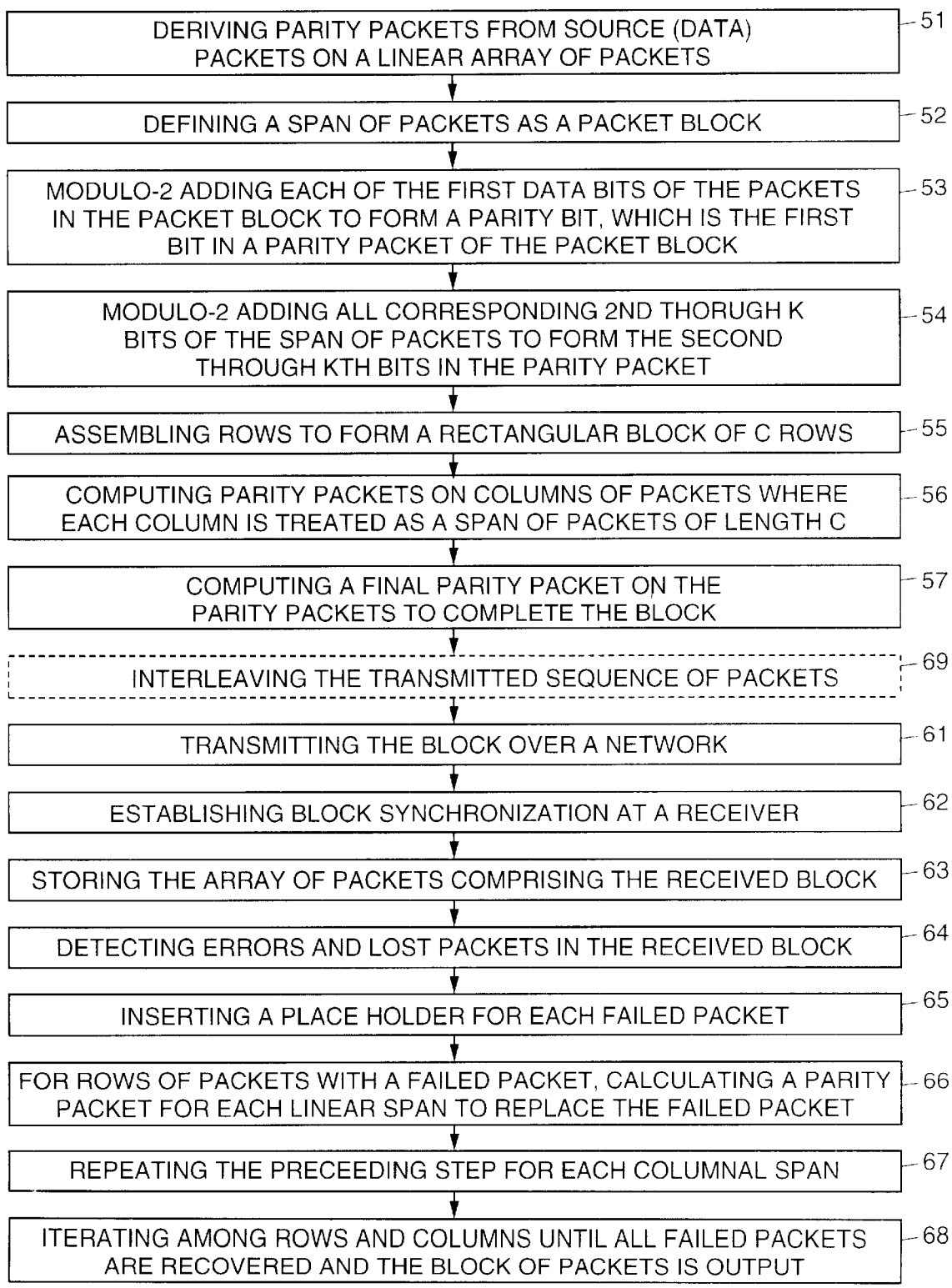

MULTI-DIMENSIONAL PACKET RECOVERY SYSTEM AND METHOD

BACKGROUND

The present invention relates generally to packet data transmission systems and method, and more particularly, to a multi-dimensional packet recovery system and method for restoring lost packets in a network environment.

U.S. Pat. No. 5,432,787 entitled "Packet data transmission system with adaptive data recovery method", assigned to the assignee of the present invention discloses a packet communication system that uses a recovery method in which a "parity" packet is added to a transmitted packet string for each span (sequence) of K data packets. The parity packet's data field is comprised of the modulo-2 sum of the respective data bits of all of the K packets in the span.

More particularly, this packet communication system transmits a stream of L data packets with at least one parity packet transmitted as an L+1$^{th}$ packet. The parity packet comprises at least N data segments, each i$^{th}$ data segment being the modulo-2 sum of all identically positioned data segments in the stream of L packets. A node includes adaptive packet stream transmission apparatus which comprises a packet queue for holding a series of packets ready for transmission to a destination node. The adaptive packet stream transmission mechanism further includes modulo-2 sum circuitry for deriving a parity packet for each L transmitted data packets.

Transmission control circuitry selectively enables transmission of a parity packet after each L data packets have been transmitted. A processor in the node controls the transmission control circuitry to vary the value of L in accordance with a determined network metric. The network metric may indicate a level of network congestion, with the processor increasing the value of L if the network metric manifests a lessened network congestion, and vice versa. The processor may vary the value of L in accordance with a data error rate metric.

However, the system disclosed in U.S. Pat. No. 5,432,787 does not address recovery of a multi-dimensional array of packets. It is therefore an objective of the present invention to provide for multi-dimensional packet recovery systems and methods that recover lost transmitted packets and packets containing transmission errors.

SUMMARY OF THE INVENTION

To accomplish the above and other objectives, the present invention provides for multi-dimensional packet recovery systems and methods that permit recovery of lost transmitted packets and packets containing transmission errors. The packet recovery system and method transmits a multi-dimensional array comprising rows, columns and hyperdimensional volumes of data packets between a source node and one or more destination nodes. The present invention improves upon the teachings of U.S. Pat. No. 5,432,787.

A two-dimensional packet array is exemplary of the multi-dimensional array with no loss of generality. Parity packets are derived from source packets on a linear array of packets. A span of packets is defined as a packet block. Each of the first data bits of the packets in the packet block are modulo-2 added to form a parity bit. This is the first bit in the parity packet of the packet block. Similarly, all corresponding 2nd through k bits of the member packets are modulo-2 added to form the second through kth bits in the parity packet. In the two-dimensional packet array, a span of packets may comprise a row of length R packets. Many rows are assembled to form a rectangular block of C rows. Parity packets are computed on the columns of packets where each column is treated as a span of packets of length C. A final parity packet is computed on the parity packets and completes the rectangular array.

The blocks are transmitted over a traditional network with erasures and bit errors. The receiver establishes block synchronization and stores the array of packets constituting the received block. Where errors and lost packets are detected (through CRC and missing sequenced packets) the receiver inserts a place holder for each failed packet. For all rows of packets with a failed packet, a parity packet for each linear span is calculated and is used to replace the failed packet. The procedure is then repeated for each columnar span. This process is iterated among rows and columns until all possible failed packets are recovered and the block of packets are output. The present invention implements what may be referred to as product codes with "turbo" packet recovery.

Certain arrays of failed packets are unrecoverable using the above-described process. Various arrangements of packet interleaving may be applied in the transmission sequencing so that bursts of lost packets due to a network node failure may be spread over a large number of packet blocks. The lost packets are caused to be "randomized", thus allowing the block packet recovery process to succeed.

The system and method provides for recovery of missed or failed packets of a multi-dimensional packet array in a data packet switching network. The system and method provide for recovery of failed packets resulting from transmission of packets over the data packet network without the use of retransmission (ARQ) protocols.

The present invention extends the recovery process disclosed in U.S. Pat. No. 5,432,787 to multi-dimensional arrays of packets. The present invention recovers multiple failed packets per "span", and is useful at higher failure rates than the technique disclosed in U.S. Pat. No. 5,432,787. The present invention thus extends the basic principles of forward packet recovery to higher dimensional blocks of packets. A recursive recovery method is employed in the present invention to recover multiple lost packets of a group, where such multiple losses may be unrecoverable using the techniques disclosed in U.S. Pat. No. 5,432,787.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which:

FIG. 2 illustrates an example of a two-dimensional block of data packets that is processed by the system shown in FIG. 1;

FIG. 3 illustrates an exemplary two-dimensional block of data packets with multiple errors that is processed by the system shown in FIG. 1;

FIGS. 4–7 show the recursive packet recovery process used in the system shown in FIG. 1; and FIG. 8 illustrates an exemplary packet recovery method in accordance with the principles of the present invention.

DETAILED DESCRIPTION

Figure 1:
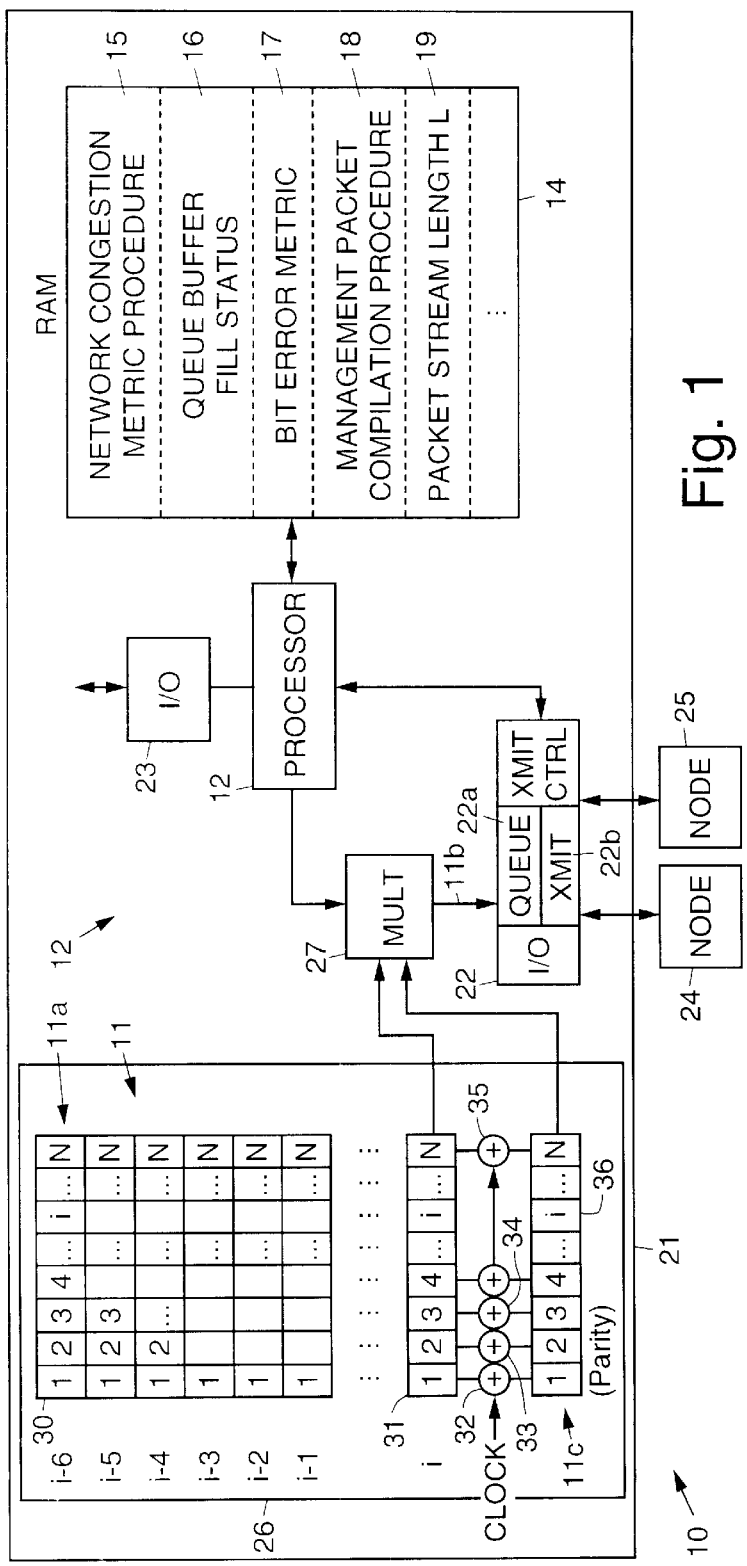
FIG. 1 illustrates an exemplary packet recovery system in accordance with the principles of the present invention.

Referring to the drawing figures, FIG. 1 illustrates an exemplary packet recovery system 10 in accordance with the principles of the present invention. FIG. 1 illustrates an exemplary two-dimensional block 11 or array 11 of data packets 11a that is processed by the system 10. FIG. 2 illustrates the exemplary two-dimensional block 11 or array 11 of data packets 11b after processing that is transmitted by the system 10. The packet recovery system 10 is used as part of a communications system that transmits data packets 11a between a source node 21 and one or more destination nodes 24, 25.

The data packets 11a have N data segments and are transmitted by the source node 21 in streams of L data packets 11a, where N and L are integers. Parity packets 11c (FIG. 2) are transmitted as $(L+1)^{th}$ packets 11c by the source node 21 after each stream of L data packets 11a. The parity packets 11c comprise N data segments that are each a modulo 2 sum of all identically positioned data segments in the stream of L data packets 11a.

Each source node 21 includes adaptive packet stream transmission apparatus 22 comprising a first input/output (I/O) module 22. The adaptive packet stream transmission apparatus 22 or first input/output (I/O) module 22 comprises a packet queue 22a for holding a series of data and parity packets 11a, 11c that are ready for transmission to a destination node 24, 25, and transmission apparatus (XMIT) 22b coupled to the packet queue 22a for transmitting the data and parity packets 11a, 11c.

Modulo 2 sum circuitry 32, 33, 34 . . . 35 is provided that generates a parity packet 11c for L transmitted data packets 11a. Transmission control circuitry (XMIT CNTR) 22c is coupled to the transmission apparatus 22 that selectively enables the transmission apparatus 22 to transmit a parity packet 11c after each L data packets 11a have been transmitted to a destination node 24, 25. The processor 12 is coupled to the transmission control circuitry and determines a network metric that indicates a network condition and controls the transmission control circuitry to vary a value of L during operation of the communication system in accordance with the determined network metric.

The processor 12 controls overall operation of the node 21. The processor 12 is coupled to a random access memory (RAM) 14 that stores, among other programs, a network congestion metric procedure 15, a queue buffer fill status value 16, a bit error metric value 17, a management packet compilation procedure 18, and a packet stream length 19 of value L. The node 21 includes a second input/output (I/O) module 23 that receives data and parity packets 11a, 11c from previous nodes, and the second input/output (I/O) module 23 that enables output of data and parity packets 11a, 11c to destination nodes 24, 25 (two of which are shown).

The node 21 includes a transmit packet buffer 26 that enables the processor 12 to construct outgoing packets 11a for transmission by way of a multiplexer (MULT) 27 and the first I/O module 22 to a destination node 24, 25. The transmit packet buffer 26 comprises a first-in/first-out (FIFO) buffer that includes a plurality of registers 30. Each register 30 includes N bit storage positions, where N is the total number of bits in a data packet 11a. As a data packet 11a works its way down transmit packet buffer 26, it reaches a final register 31 where it is ready for transmission, by way of the multiplexer 27 and the first I/O module 22 to the destination node 24, 25.

The present invention processes the data packets (D) 11a in each of the rows and columns of data packets 11a in the array 11. The present invention generates parity packets (P) 11c in the respective rows and columns of the array 11 that are transmitted with the data packets 11a. Thus, for an exemplary 7×7 array 11 of data packets 11a shown in FIG. 2, each row of data packets (D) 11a is processed to produce the lowermost row of parity packets (P) 11c, each column of data packets (D) 11a is processed to produce the rightmost column of parity packets (P) 11c, and the row and column of parity packets 11c are processed to produce the lower rightmost parity packet 11c. This processing is achieved in the following manner.

When a data packet 11a arrives at the final register 31, each bit value of the packet 11a is fed through the modulo 2 sum adder 32, 33, 34 . . . 35, to a parity packet register 36. In this manner, the bit values in the parity packet register 36 continually represent the modulo 2 sum of all like bit positions of data packets 11a that have reached the final register 31 and that have been transmitted.

Every L data packets 11a that are transmitted from the final register 31 are followed by a parity packet 11c from the parity packet register 36 that is sent to the multiplexer 27, in response to control signals from the processor 12. The processor 12 controls the value of L in accordance with a plurality of network metrics that enable the processor 12 to adjust the value of L in accordance with network congestion, bit error rate variations, or other network parameters.

Figure 1A:
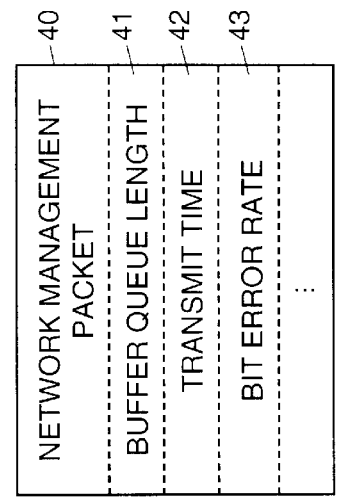
FIG. 1a illustrates a network management packet employed by the invention to enable network metrics to be calculated by a node.

FIG. 1a illustrates a network management packet 40 that enables the processor 12 to derive data from destination nodes 24, 25 to enable adjustment of the value of L. The network management packet 40, among other data parameters, includes a buffer queue length field 41, a transmit time field 42, and a bit error value field 43.

Periodically, the processor 12 causes transmission of a network management packet 40 to a destination node 24, 25 (or nodes). The destination node 24, 25 (or nodes) returns the network management packet 40 to the processor 12 and inserts determined values in the fields 41, 42, 43, respectively. For instance, when the processor 12 causes a network management packet 40 to be transmitted, it inserts a transmit time into the transmit time field 42 so that when the network management packet 40 is returned from the destination node 24, 25 (or nodes), the transmission time of the network management packet 40 can be determined. If the transmission time exceeds a predetermined value, the processor 12 increases the value of L to decrease packet recovery overhead load in the network.

A destination node 24, 25 that receives a network management packet 40 may insert a value in the buffer queue length field 41 that is indicative of the length of its buffer queue. Further, it may insert a value in bit error value field 43 that is indicative of bit error induced failures that have been experienced with preceding packets 11a, 11c. The processor 12, upon receiving a return network management packet 40, employs the values in the network management packet 40 to adjust the value of L to either increase its value when network statistics indicate low network congestion and/or low bit error rates, or to decrease the value of L in the event of high network congestion and/or high bit error rates. Lower values of L enable more parity packets 11c to be transmitted and assure an ability to recover more lost packets 11a, 11c and vice-versa.

The network management packets 40 are transmitted with sufficient redundancy to guarantee survival. The network management packets 40 are transmitted only occasionally (consistent with long term rates of change of network status) on intervals of minutes to 10's of minutes. Network management packets 40 represent less than 1% of additional load to the network and do not impact upon overall network loading.

While bounds for the value of L may vary in accordance with a specific network, it is preferred that the lower bound on the span of L be approximately 7 during heavy congestion or in a high bit error state. The value of L may increase to as many as 31 packets 11a for low error rate and congestion network states.

If a node 21 (or any destination node 24, 25), detects a change in local congestion, it initiates a dialogue with a preceding node 21, 24, 25 and the parameter L is suitably altered. In this manner, parameter L is caused to adapt to network conditions and cooperating nodes 21, 24, 25 coordinate their recovery operations.

As an example of the procedure employed by a node 21, reference is made to FIGS. 3–7. An example of a two-dimensional block 11 or array 11 with multiple errors (lost packets 11a or failed packets 11a, 11c that include bit/byte errors) is shown in FIG. 3. FIGS. 4–7 show the recursive packet recovery process, and in this example, all lost packets 11a, 11c are recovered, as is shown in FIG. 7.

Cells shown in FIGS. 4–7 that are marked with a P are parity packets 11c, whereas packets 11a marked with a D are "payload data" packets 11a. Data packets 11a marked with an E are failed packets 11a. As in U.S. Pat. No. 5,432,787 where the span (K) may be adapted to network conditions, the block size of the n-dimensional block 22 of Kn packets 11a, 11c may also be adapted.

In the example illustrated with reference to FIGS. 4–7, the block of 49 data packets 11a (a 7×7 data packet array) is provided with a total of 15 parity packets 11c. The example also illustrates one failed parity packet 11c which must also be recovered to provide for complete recovery of all failed packets 11a, 11c.

The lost or failed packets 11a, 11c are recovered upon reception by performing a modulo 2 sum of the bits in the packet 11a, 11c containing an error with the bits in the corresponding parity packet 11c for the associated row or column. This procedure is iterated for each error that is detected until all packets 11a, 11c are recovered.

Many packet failures are shown, and some that will fall to be recovered using the concept disclosed in U.S. Pat. No. 5,432,787, in that more than one packet failure per row was encountered. In the two-dimensional array 11, alternating row and column corrections are performed and in this example, all failed packets 11a, 11c are recovered. The costs of this added recovery ability are the additional parity packets 11c and much more memory, processing latency and system complexity.

It is unlikely that more than three iterations of row and column processing would be required for full recovery. There are many (unlikely) failed packet groupings that would cause a recovery failure and the statistics of these events may be estimated using either analytical methods or statistically based system simulation.

The basic recovery process discussed above may be extended to higher dimensional arrays 11 with commensurate complexity, overhead, and so forth. This is achieved by generating and transmitting additional parity packets 11c along the added dimension of the array 11.

FIG. 8 illustrates an exemplary packet recovery method 50 in accordance with the principles of the present invention. The method 50 transmits a multi-dimensional array 11 comprising rows, columns and hyperdimensional volumes of data packets 11a between a source node 21 and one or more destination nodes 24, 25. A two-dimensional packet array 11 is exemplary of the multi-dimensional array 11 without loss of generality. The exemplary method 50 comprises the following steps.

Parity packets 11c are derived 51 from source (data) packets 11a on a linear array of packets. A span of packets 11a is defined 52 as a packet block. Each of the first data bits of the packets 11a in the packet block are modulo-2 added 53 to form a parity bit. This is the first bit in a parity packet 11c of the packet block. Similarly, all corresponding 2nd through k bits of the span of packets 11a are modulo-2 added 54 to form the second through kth bits in the parity packet 11c. In the two-dimensional packet array 11, the span of packets may comprise a row of length R packets 11a. Many rows are assembled 55 to form a rectangular block of C rows. Parity packets 11c are computed 56 on columns of packets 11a where each column is treated as a span of packets of length C. A final parity packet is computed 57 on the parity packets 11c and completes the rectangular array or block.

The block is transmitted 61 over a traditional network with erasures and bit errors. The receiver establishes 62 block synchronization and stores 63 the array of packets constituting the received block. Where errors and lost packets 11a are detected 64 (through CRC and missing sequenced packets) the receiver inserts 65 a place holder for each failed packet 11a. For all rows of packets 11a with a failed packet, a parity packet 11c for each linear span is calculated 66 and is used to replace the failed packet 11a. The preceding step is repeated 67 for each columnar span. The process is iterated 68 among rows and columns until all possible failed packets are recovered and the block of packets are output. The present invention implements what may be referred to as product codes with "turbo" decoding.

Certain arrays of failed packets are unrecoverable using the above-described method 50. However, various arrangements of packet interleaving 68 may be applied in the transmission sequencing so that bursts of lost packets 11a due to network node failure may be spread over a large number of packet blocks. The lost packets 11a are caused to be "randomized", thus allowing the block packet recovery method 50 to succeed.

Thus, an improved multi-dimensional packet recovery system and method for restoring lost packets in a network environment have been disclosed. It is to be understood that the above-described embodiment is merely illustrative of some of the many specific embodiments that represent applications of the principles of the present invention. Clearly, numerous and other arrangements can be readily devised by those skilled in the art without departing from the scope of the invention.

What is claimed is:

1. A packet recovery system for use in recovering lost packets and packets containing transmission errors, comprising:

circuitry for deriving parity packets from source packets, and wherein a span of data packets comprises a packet block;

circuitry for modulo-2 adding respective bits of the data packets of the packet block to produce a respective plurality of parity bits;

circuitry for assembling rows of packets to form a block of packets;

circuitry for computing parity packets on columns of packets where each column is treated as a span of packets, and for computing a final parity packet on the parity packets to produce a multi-dimensional block;

circuitry for transmitting a multi-dimensional block over a network;

circuitry for receiving and storing the transmitted block and for establishing block synchronization;

circuitry for detecting errors and lost packets in the received block;

circuitry for inserting a place holder for each failed packet;

circuitry for processing rows of packets with a failed packet for each columnar span to calculate a parity packet for each linear span for each failed packet, that iterates among the linear spans until all lost data packets and data packets containing transmission errors are recovered, and that outputs a multi-dimensional array containing recovered packets.

2. The packet recovery system recited in claim 1 which further comprises:

circuitry for interleaving packets that are transmitted so that bursts of lost packets due to a network failure are spread over a large number of packet blocks.

3. The packet recovery system recited in claim 1 which further comprises:

circuitry for assembling volumes of packets to form the block of packets; and circuitry for computing parity packets on volumes of packets where each volume is treated as a span of packets, and for computing a final parity packet on the parity packets to produce the multi-dimensional block.

4. The packet recovery system 10 recited in claim 1 which further comprises:

circuitry for assembling hypervolumes of packets to form the block of packets; and circuitry for computing parity packets on volumes of packets where each hypervolume is treated as a span of packets, and for computing a final parity packet on the parity packets to produce the multi-dimensional block.

5. A packet recovery method for use in recovering lost packets and packets containing transmission errors, comprising the steps of:

deriving parity packets from source packets, on a linear array of data packets;

defining a span of data packets as a packet block;

modulo-2 adding respective bits of the data packets of the packet block to produce a respective plurality of parity bits;

assembling rows of packets to form a block of packets;

computing parity packets on columns of packets where each column is treated as a span of packets;

computing a final parity packet on the parity packets to produce a multi-dimensional block;

transmitting the multi-dimensional block over a network;

receiving the transmitted block and establishing block synchronization;

storing the packets of the received block;

detecting errors and lost packets in the received block;

inserting a place holder for each failed packet;

for rows of packets with a failed packet, calculating a parity packet for each linear span for each failed packet;

repeating the preceding step for each columnar span;

iterating among the linear spans until all lost data packets and data packets containing transmission errors are recovered; and outputting a multi-dimensional array containing the recovered packets.

6. The packet recovery method recited in claim 5 which further comprises:

interleaving packets that are transmitted so that bursts of lost packets due to a network failure are spread over a large number of packet blocks.

7. The packet recovery method recited in claim 5 which further comprises:

assembling volumes of packets to form the block of packets; and computing parity packets on volumes of packets where each volume is treated as a span of packets, and for computing a final parity packet on the parity packets to produce the multi-dimensional block.

8. The packet recovery method recited in claim 5 which further comprises:

assembling hypervolumes of packets to form the block of packets; and computing parity packets on volumes of packets where each hypervolume is treated as a span of packets, and for computing a final parity packet on the parity packets to produce the multi-dimensional block.

\* \* \* \* \*